(12) United States Patent
Takada (10) Patent No.: US 7,990,295 B2
(45) Date of Patent: Aug. 2, 2011

(54) DATA TRANSFER APPARATUS

(75) Inventor: Shuichi Takada, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/717,593

(22) Filed: Mar. 4, 2010

(65) Prior Publication Data

US 2011/0063144 A1 Mar. 17, 2011

(30) Foreign Application Priority Data

Sep. 16, 2009 (JP) ................................. 2009-214616

(51) Int. Cl.
*H03M 9/00* (2006.01)

(52) U.S. Cl. .................... 341/101; 370/366; 375/354

(58) Field of Classification Search .......... 341/100–101; 370/509, 366, 542, 537; 347/61, 9, 10; 375/364, 375/365, 368, 354, 377, 326, 359; 400/120.01, 400/124.01; 710/71

See application file for complete search history.

(56) References Cited

U.S. PATENT DOCUMENTS

| 5,012,240 | A | * | 4/1991 | Takahashi et al. | 341/101 |
| 5,587,709 | A | * | 12/1996 | Jeong | 341/100 |
| 5,726,651 | A | * | 3/1998 | Belot | 341/101 |
| 6,107,946 | A | * | 8/2000 | Jeong | 341/101 |
| 6,741,193 | B2 | * | 5/2004 | Nagata | 341/101 |
| 6,755,580 | B2 | * | 6/2004 | Furukawa et al. | 400/120.01 |
| 7,292,668 | B2 | * | 11/2007 | Yamawaki | 375/364 |
| 7,345,520 | B2 | * | 3/2008 | Isono | 327/276 |
| 7,345,602 | B2 | * | 3/2008 | Saeki et al. | 341/101 |
| 7,364,272 | B2 | * | 4/2008 | Furukawa et al. | 347/61 |
| 7,471,752 | B2 | * | 12/2008 | Ge et al. | 341/101 |
| 7,848,318 | B2 | * | 12/2010 | Nguyen et al. | 341/100 |
| 2005/0147178 | A1 | * | 7/2005 | Kikuchi | 375/288 |

FOREIGN PATENT DOCUMENTS

| JP | 11-127141 | 5/1999 |
| JP | 2003-198874 | 7/2003 |

* cited by examiner

*Primary Examiner* — Lam T Mai
(74) *Attorney, Agent, or Firm* — Turocy & Watson, LLP (57) ABSTRACT

A data transfer apparatus includes a clock generation unit to generate a clock signal, a control unit to output parallel data and a reset signal, and a plurality of transmission units. Each of the plurality of transmission units uses continuous rising edges of a bit clock to sample the reset signal multiple times so that a phase shift of the reset signal between the transmission units is reduced, and the phase of the frequency dividing clock is aligned in each transmission unit.

16 Claims, 6 Drawing Sheets

DATA TRANSFER APPARATUS

CROSS-REFERENCE TO RELATED APPLICATION

This application is based upon and claims the benefit of priority from prior Japanese Patent Application No. 2009-214616, filed Sep. 16, 2009, the entire contents of which are incorporated herein by reference.

BACKGROUND OF THE INVENTION

1. Field of the Invention

The invention relates to a data transfer apparatus including a serializer converting parallel data into serial data based on clock signal.

2. Description of the Related Art

Serial transfer interfaces such as SATA (Serial Advanced Technology Attachment) and PCIe (PCI Express) have a plurality of lanes for transmission and reception of data. In terms of the power consumption and noises, the number of signal lines distributing clock signals to each lane is preferably small. In addition, it is required to align the phases of clocks among the lanes (align the timing of reset) in order to perform data transfer correctly.

In order to solve the above problems, Japanese Laid Open Patent Application No. 1999-127141, for example, suggests a communication system including a parent module for generating a clock used in a module and a reset pulse with a regular interval and a child module for generating a clock used in the child module and resetting with the predetermined interval based on the reset pulse, wherein the clock in the parent module and the clock in the child module are synchronized with each other.

In the above communication system described in the Japanese Patent Application Laid-Open No. 1999-127141, each of the parent module and the child module has a clock generation circuit (PLL circuit), and there is a problem in that the system has a large circuitry size and consumes much power.

BRIEF SUMMARY OF THE INVENTION

According to one aspect of the invention, a data transfer apparatus includes a clock generation unit to generate a first clock signal and a second clock signal by dividing the first clock signal by N (N is an integer of 2 or more); a control unit to receive a first reset signal and a first to Sth (S is an integer of two or more) parallel data, the control unit outputting each of the parallel data in synchronization with the second clock signal and a second reset signal in synchronization with the second clock signal; and first and second transmission units each including; a first reset synchronizing unit to generate a third reset signal upon sampling the second reset signal multiple times using the first clock signal, a frequency dividing unit to generate a third clock signal from the first clock signal, being reset based on the third reset signal, and a serializer to convert the parallel data into serial data based on the third clock signal.

BRIEF DESCRIPTION OF THE DRAWINGS

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

A data transfer apparatus according to an exemplary embodiment of the present invention will now be described with reference to the accompanying drawings wherein the same or like reference numerals designate the same or corresponding parts throughout the several views.

Figure 1:
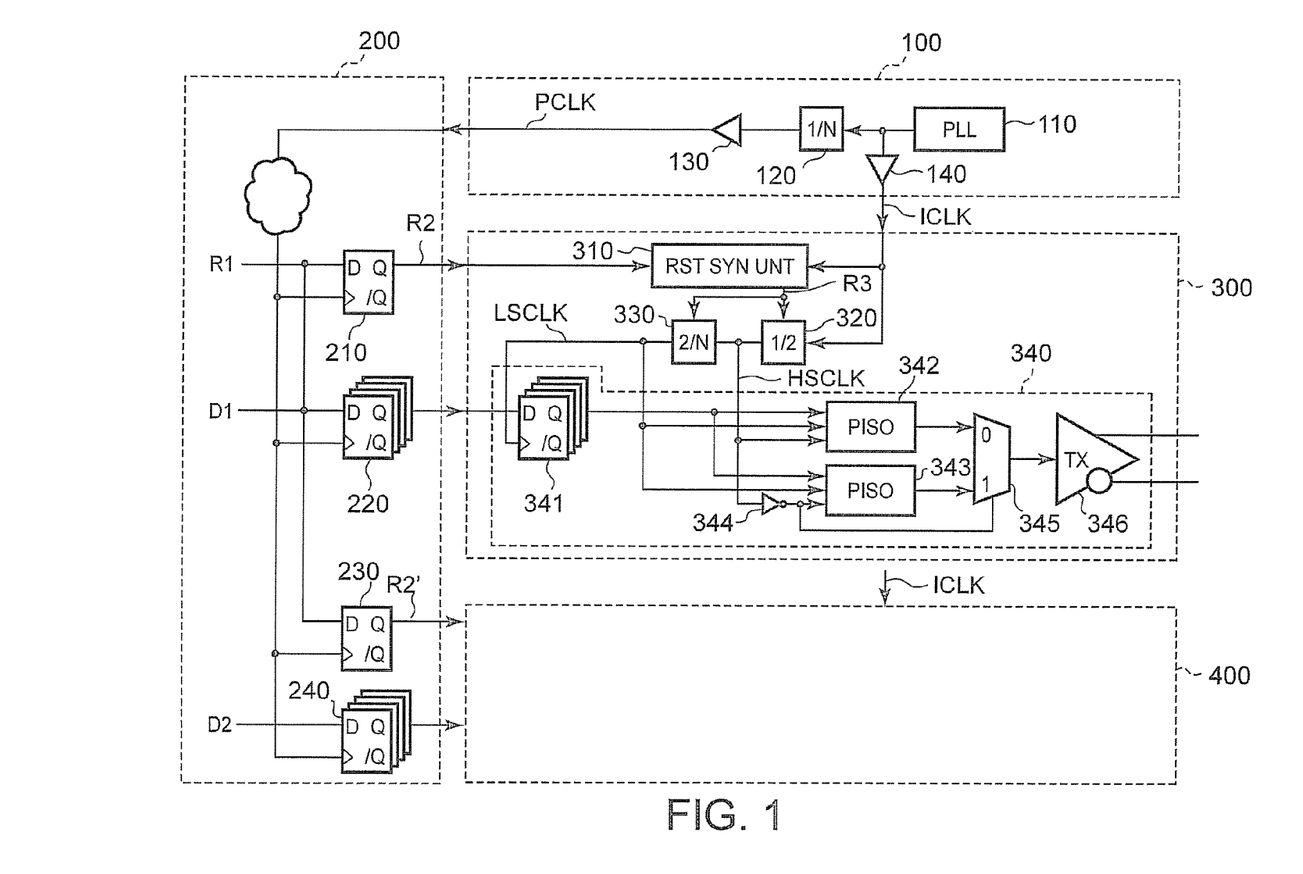
FIG. 1 is a schematic configuration diagram showing a data transfer apparatus according to a first embodiment of the invention.

A first embodiment of the invention will be described with reference to FIG. 1. FIG. 1 is a schematic configuration diagram showing a data transfer apparatus according to the first embodiment of the invention. The data transfer apparatus includes a clock generation unit 100, a control unit 200, a transmission units 300 and 400.

The clock generation unit 100 includes a PLL (Phase Locked Loop) circuit 110, a frequency divider 120, buffers 130 and 140. The PLL circuit 110 outputs a high frequency clock (bit clock) signal ICLK. The frequency divider 120 divides the clock signal ICLK output from the PLL circuit 110 by N (N is an integer of two or more), and outputs a low frequency clock signal PCLK.

The control unit 200 includes flip flops 210, 230 and flip flop groups 220, 240. The flip flop 210 holds a value of a reset signal R1 (D input) at a rising edge of the clock signal PCLK, and outputs a reset signal R2 to the transmission unit 300. The reset signal R1 is generated without synchronization with the clock signal ICLK in the outside of the control unit 200.

The flip flop group 220 includes a plurality of flip flops. Data D1, i.e., parallel data including a plurality of bits, are given to the flip flop group 220, and each bit of the data D1 is input to a corresponding flip flop. For example, when the data D1 is parallel data including ten bits, the flip flop group 220 has ten flip flops corresponding to the respective bits. Each flip flop holds a value of D input at rising edge of the clock signal PCLK, and outputs the value to the transmission unit 300.

The flip flop 230 as well as the flip flop 210 holds the value of the reset signal R1 (D input) at rising edge of the clock signal PCLK, and outputs the reset signal R2 to the transmission unit 400.

Further, the flip flop group 240 has a plurality of flip flops corresponding to the respective bits of the parallel data D2 and holds the value of D input at rising edge of the clock signal PCLK, and outputs the value to the transmission unit 400.

The transmission unit 300 includes a reset synchronizing unit 310, frequency dividers 320, 330, and a serializer 340. The transmission unit 400 has substantially the same configuration as the transmission unit 300, and the description of the transmission unit 400 is omitted. The frequency divider 320 divides the clock signal ICLK by 2, and outputs a clock signal HSCLK. The frequency divider 330 multiplies the frequency of the clock signal HSCLK by 2/N, and outputs a clock signal LSCLK. In other words, the clock signal LSCLK is a signal obtained by dividing the clock signal ICLK by N, and has the same frequency as the clock signal PCLK.

The reset synchronizing unit 310 uses the clock signal ICLK to sample the reset signal R2 a plurality of times, and outputs a sampled reset signal R3 to the frequency dividers 320, 330. The reset synchronizing unit 310 uses adjacent (continuous) rising edges of the clock signal ICLK to perform sampling.

Figure 2:
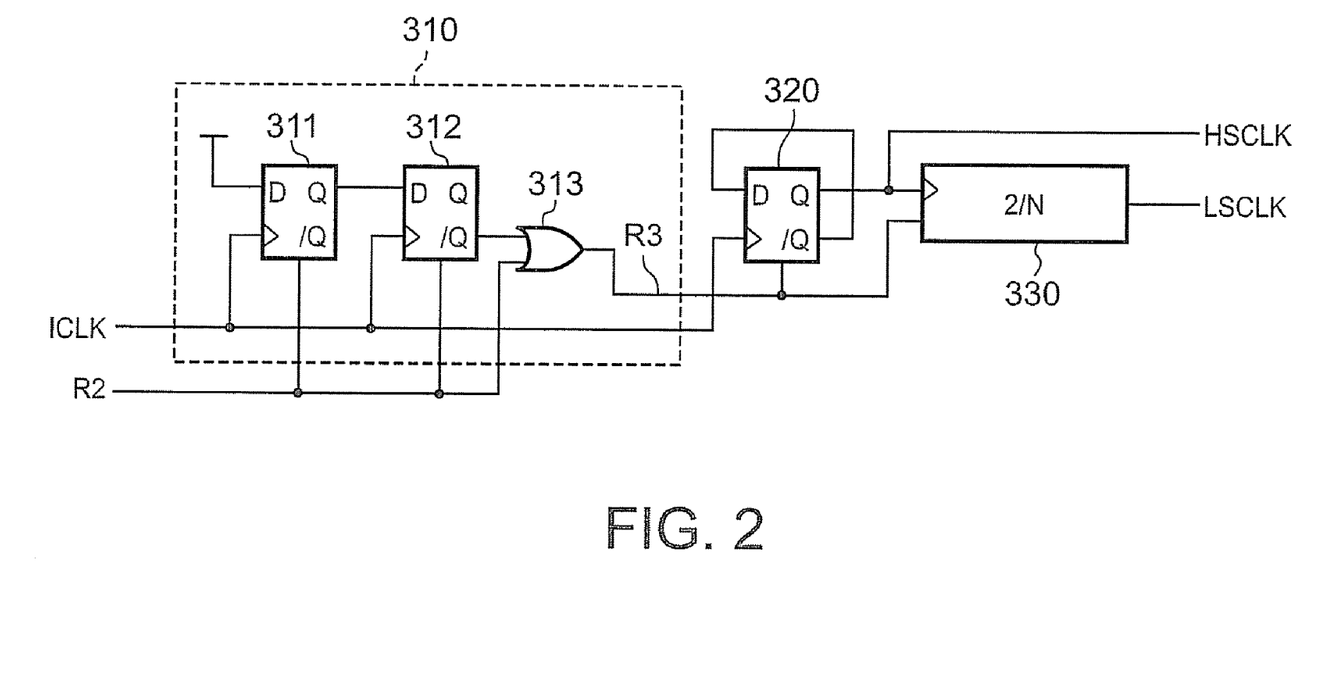
FIG. 2 is a schematic configuration diagram showing a reset synchronizing unit used in the data transfer apparatus shown in FIG. 1.

FIG. 2 shows a schematic configuration diagram showing the reset synchronizing unit 310 and the frequency divider 320 and 330. The reset synchronizing unit 310 has flip flops 311, 312 and an OR gate 313. The flip flop 311 is a D-type flip flop. The D input of the flip flop 311 receives high level. The flip flop 311 operates in synchronization with the clock signal ICLK. The flip flop 311 is reset by the reset signal R2.

The Q output of the flip flop 311 is given to the D input of the flip flop 312. The flip flop 312 operates in synchronization with the clock signal ICLK. The flip flop 312 is reset by the reset signal R2. The /Q output of the flip flop 312 and the reset signal R2 are given to the OR gate 313, and the OR gate 313 outputs the reset signal R3.

The frequency divider 320 is structured by the flip flop whose D input and /Q output are connected with each other. When the clock changes two times, the output change one time. The flip flop operates using the clock signal ICLK as a clock, and is reset by the reset signal R3.

Figure 3:
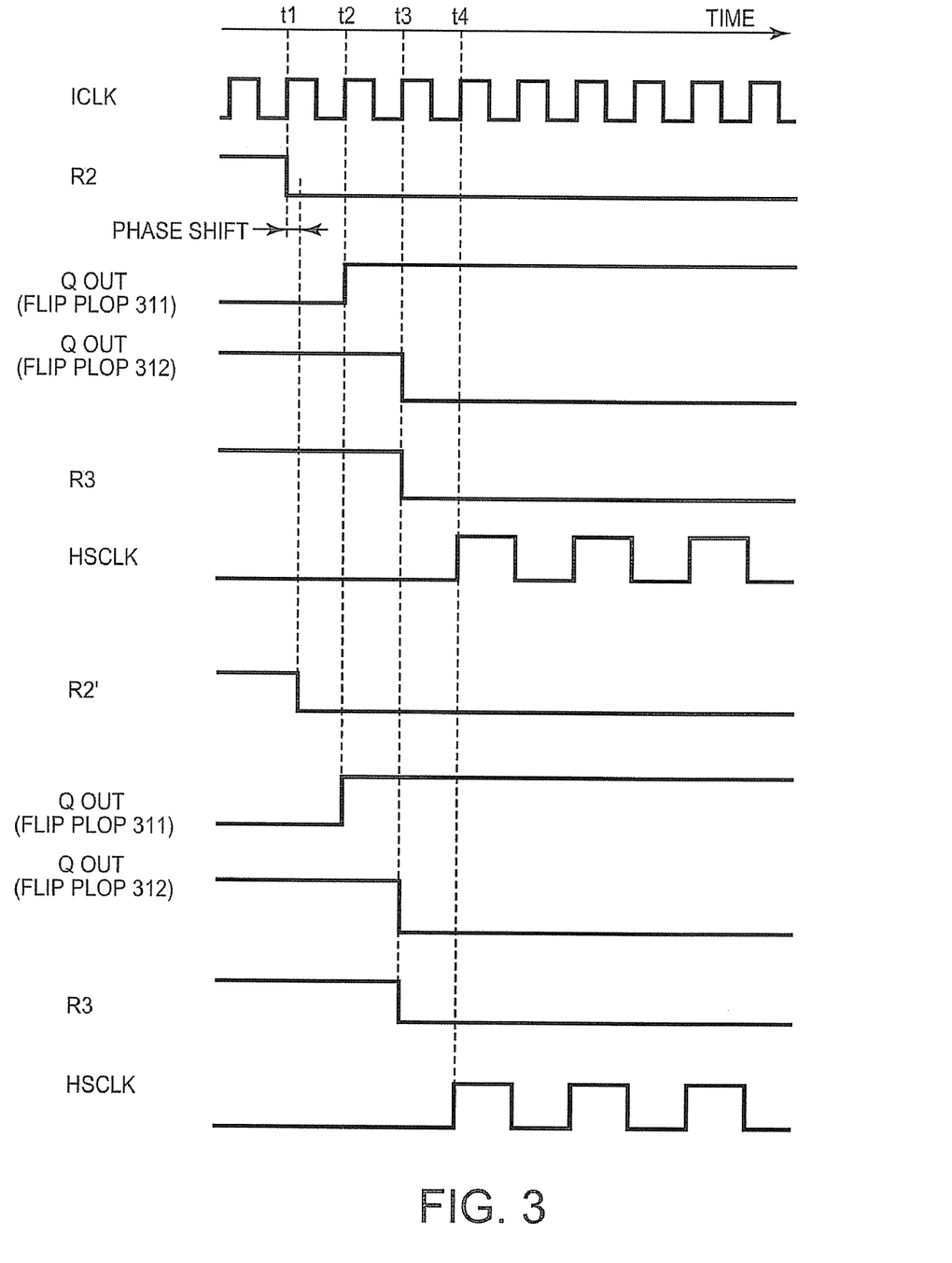
FIG. 3 is a timing chart showing transition of a reset signal and a frequency dividing clock in the data transfer apparatus shown in FIG. 1.

FIG. 3 is an example of a timing chart showing the clock signal ICLK, the reset signal R2, the Q output of the flip flop 311, the /Q output of the flip flop 312, the reset signal R3, and the clock signal HSCLK.

The FIG. 3 also shows a reset signal R2' that has a timing slightly shifted from the fall (release reset) of the reset signal R2, the Q output of the flip flop 311 corresponding to the reset signal R2', the /Q output of the flip flop 312, the reset signal R3, and the clock signal HSCLK. The upper row of FIG. 3 is a timing chart corresponding to the reset signal R2, and the lower row of FIG. 3 is a timing chart corresponding to the reset signal R2'.

As shown in FIG. 3, the reset signal R2 falls at the same time as the rise (time t1) of the lock signal ICLK. Therefore, the reset of the flip flops 311, 312 is released. The Q output of the flip flop 311 rises when the clock signal ICLK subsequently rises (time t2). This corresponds to the first sampling of the reset signal R2 by the clock signal ICLK. Then, the IQ output of the flip flop 312 falls when the clock signal ICLK subsequently rises (time t3). This corresponds to the second sampling of the reset signal R2 by the clock signal ICLK.

Since the reset signal R2 has already fallen at the time t1, the reset signal R3 output by the OR gate 313 falls at the time t3 according to the fall of the /Q output of the flip flop 312. Accordingly, the reset of the flip flop 320 is released, and the flip flop 320 begins to operate. The flip flop 320 starts output of the clock signal HSCLK when the reset signal R3 falls and then the clock signal ICLK subsequently rises, namely, at a time t4.

Further, as shown in FIG. 3, the reset signal R2' falls slightly after the time t1. Accordingly, the reset of the flip flops 311, 312 is released. The Q output of the flip flop 311 rises when the clock signal ICLK subsequently rises (time t2). Then, the /Q output of the flip flop 312 falls when the clock signal ICLK subsequently rises (time t3).

Since the reset signal R2' fell before the time t3, the reset signal R3 output from the OR gate 313 falls at the time t3 according to the fall of the /Q output of the flip flop 312. Accordingly, the reset of the flip flop 320 is released, and the flip flop 320 begins to operate. The flip flop 320 begins to output the clock signal HSCLK when the reset signal R3 falls and then the clock signal ICLK subsequently rises, namely, at the time t4.

As described above, the reset signal R3 corresponding to the reset signal R2 and the reset signal R3 corresponding to the reset signal R2' are generated by using output changes of the two flip flops 311, 312 operating in synchronization with the clock signal ICLK. Accordingly, even when the phases (timing of reset release operation) of the reset signals R2, R2' are slightly shifted, the reset signal R3 corresponding to the reset signal R2 and the reset signal R3 corresponding to the reset signal R2' are found to have the phases not shifted from each other.

Since the phase of the reset signal R3 does not shift, the clock signal HSCLK and the clock signal LSCLK respectively corresponding to the reset signals R2, R2' are in synchronization with each other.

The phases of the reset signal R3 respectively corresponding to the reset signals R2, R2' match with each other, when the phase difference between the reset signals R2, R2' is equal to or less than one cycle of the clock signal ICLK, and when the rise of the clock signal ICLK does not exist between the fall of the reset signal R2 and the fall of the reset signal R2'.

Therefore, even when there is a phase difference (equal to or less than one cycle of the clock signal ICLK) between the reset signal R2 given to the transmission unit 300 and the reset signal R2 given to the transmission unit 400, the reset synchronizing unit 310 aligns the phase of the reset signal given to the frequency dividers 320, 330 in the transmission units 300 and 400. Therefore, the frequency dividing clocks (the clock signals HSCLK, LSCLK) have the same phase between the transmission unit 300 and the transmission unit 400.

The serializer 340 will be explained with reference to FIG. 1. The serializer 340 includes a flip flop group 341, parallel input and series output shift registers (hereinafter referred to as PISO) 342, 343, an inverter 344, a selector 345, and an output driver 346.

The flip flop group 341 includes a plurality of flip flops corresponding to the bits of the parallel data D1 output from the flip flop group 220 and maintains the value of the D input at rising edge of the clock signal LSCLK, and outputs the value to the PISOs 342, 343.

Te PISOs 342, 343 convert the input parallel data into serial data, and output the serial data to the selector 345. The PISO 342 operates in synchronization with the clock signal HSCLK, and the PISO 343 operates in synchronization with the clock signal HSCLK inverted by the inverter 344.

The selector 345 alternately selects serial data output from the PISOs 342, 343, and outputs the selected serial data, based on the output of the inverter 344. In other words, the selector 345 outputs odd-numbered data in the serial data output from the PISO 342 and even-numbered data in the serial data output from the PISO 343. As a result, the selector 345 can output the serial data in order in the same cycle as the clock signal ICLK. The output driver 346 differentially outputs the serial data output from the selector 345.

As described above, even when there is a shift in the phase of the reset signal R2 given to the transmission unit 300 and the transmission unit 400, the internally-generated frequency dividing clocks (clock signals HSCLK, LSCLK) have the same phase. Therefore, the transmission unit 300 and the transmission unit 400 can output serial data having the same phase.

Only one PLL circuit 110 is required to generate bit clock (clock signal ICLK). Since the bit clock is distributed to each of the transmission units, each of the transmission units generates a frequency dividing clock therein, the size of the circuitry and the power consumption can be reduced, and the cost can be reduced.

As described above, with the data transfer apparatus according to the embodiment, the displacement of reset timing between the plurality of circuits can be reduced, and the cost can be reduced.

The data transfer apparatus according to the embodiment has two transmission units. Alternatively, the data transfer apparatus may be configured to have three or more transmission units.

The data transfer apparatus according to the embodiment includes the plurality of transmission units that convert parallel data in serial data and transmit the serial data. Alternatively, the data transfer apparatus may be configured to have SerDes (SERializer/DESerializer) further arranged with a reception unit for receiving the serial data and converting the received serial data into parallel data.

In the embodiment, the reset synchronizing unit 310 has two flip flops (flip flops 311, 312), and performs sampling of the reset signal R2 two times. Alternatively three or more flip flops may be arranged, and the sampling may be performed three or more times.

In the embodiment, the transmission units 300 and 400 give the reset signal R3 having the same phase to the frequency dividers 320, 330, when the phase difference between the reset signals R2 given to the transmission unit 300 and the reset signal R2 given to the transmission unit 400 is equal to or less than one cycle of the clock signal ICLK, and when the rise of the clock signal ICLK does not exist between the falls of the two reset signals R2. When there is a rise of the clock signal ICLK between the falls of the two reset signals R2, the phase of the reset signal R3 is shifted by one cycle from the clock signal ICLK. However, a generally-available data transfer apparatus tolerates a phase shift of the reset signals between the transmission units up to one cycle of the clock signal ICLK, and accordingly, the shift of one cycle does not matter in terms of operation.

A second embodiment of the invention will be described with reference to FIG. 4. Even where a rise of the clock signal ICLK exists between the falls of the two reset signals R2, the phase of the reset signal R3 can be aligned.

Figure 4:
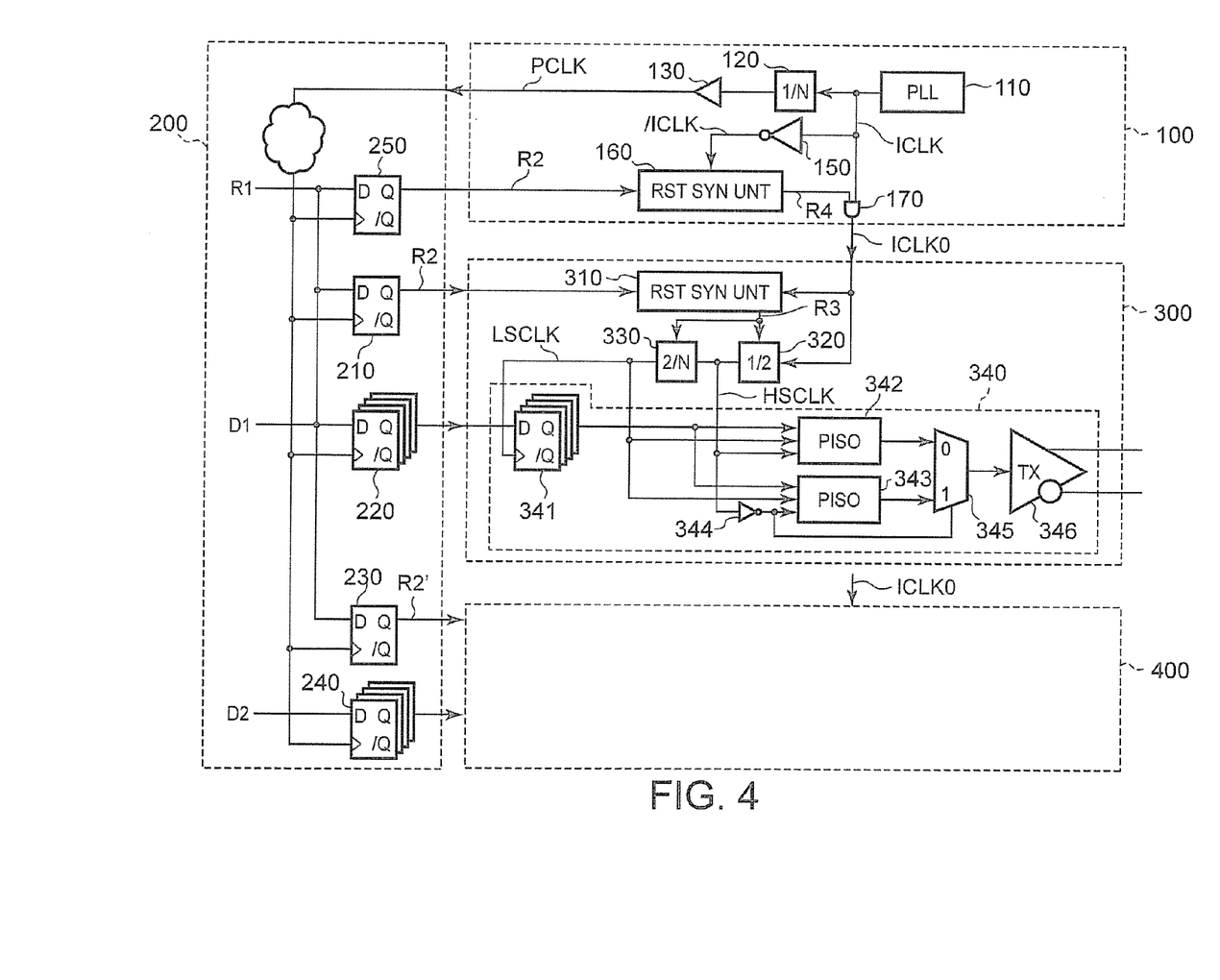
FIG. 4 is a schematic configuration diagram showing a data transfer apparatus according to a second embodiment.

When compared with the clock generation unit 100 according to the first embodiment, the data transfer apparatus according to the second embodiment shown in FIG. 4 does not have the buffer 140, but additionally includes an inverter 150, a reset synchronizing unit 160, and an AND gate 170. Further, a control unit 200 has a flip flop 250. The flip flop 250 holds the value of the reset signal R1 (D input) at rising edge of the clock signal PCLK, and outputs the reset signal R2 to the reset synchronizing unit 160.

An inverted clock signal /ICLK is given to the reset synchronizing unit 160 via the inverter 150. The reset synchronizing unit 160 uses the inverted clock signal /ICLK to sample the reset signal R2 multiple times, and generates a reset signal R4. The details of the generation processing of the reset signal R4 will be explained later.

The clock signal ICLK and the reset signal R4 are given to the AND gate 170. When the reset signal R4 attains high level, the AND gate 170 outputs a clock signal ICLKO having the same frequency as the clock signal ICLK. The clock signal ICLKO is given to a reset synchronizing unit 310 and the frequency dividing unit 320 in transmission units 300, 400.

Figure 5:
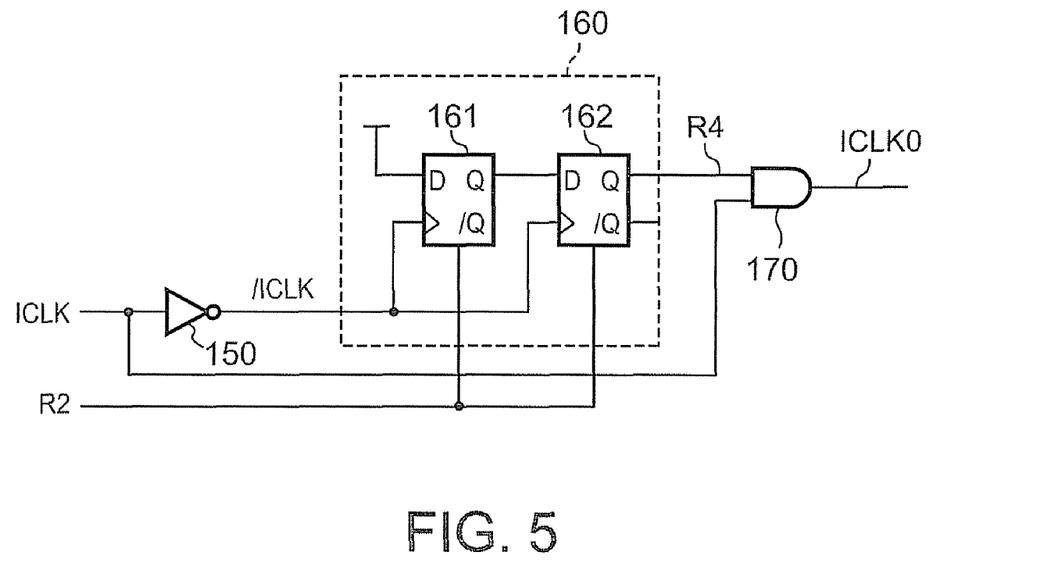
FIG. 5 is a schematic configuration diagram showing a reset synchronizing unit in the data transfer apparatus shown in FIG. 4.

FIG. 5 is a schematic configuration of the reset synchronizing unit 160. The reset synchronizing unit 160 includes flip flops 161 and 162. The flip flop 161 is a D-type flip flop. A high level is given to the D input of the flip flop 161. The flip flop 161 operates in synchronization with the inverted clock signal /ICLK. The flip flop 161 is reset by the reset signal R2.

The Q output of the flip flop 161 is given to the D input of the flip flop 162. The flip flop 162 operates in synchronization with the inverted clock signal /ICLK. Further the flip flop 162 is reset by the reset signal R2. The Q output (reset signal R4) of the flip flop 162 and the clock signal ICLK are given to the AND gate 170, and the AND gate 170 outputs the clock signal ICLKO.

Figure 6:
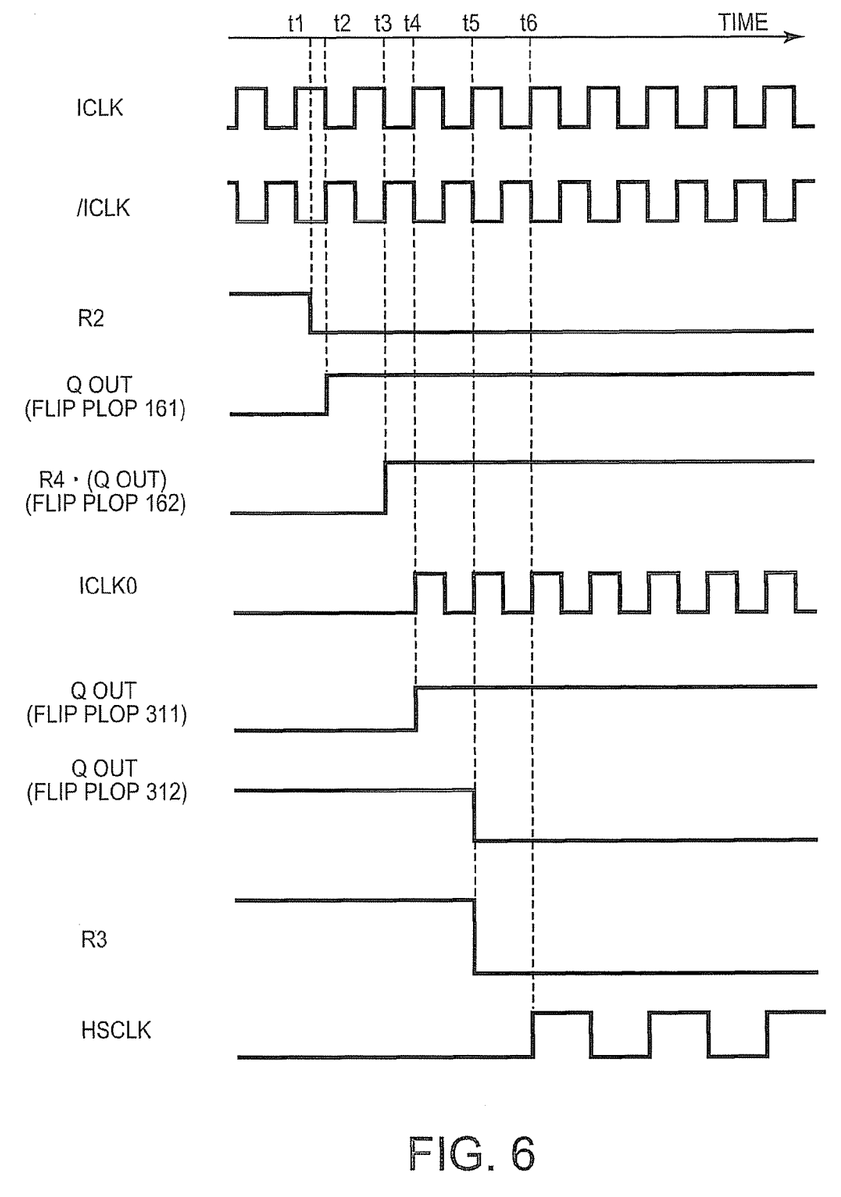
FIG. 6 is a timing chart showing transition of each signal in the data transfer apparatus shown in FIG. 2.

FIG. 6 is an example of a timing chart showing the clock signal ICLK of the data transfer apparatus thus structured, the inverted clock signal /ICLK, the clock signal ICLKO, the reset signals R2 to R4, the outputs of the flip flops 161, 162, 311, 312, and the clock signal HSCLK.

When the reset signal R2 falls at the time t1, the reset of the flip flops 161, 162, 311, 312 are released. When the inverted clock signal /ICLK thereafter rises (time t2), the Q output of the flip flop 161 attains high level. At this moment, the clock signal ICLKO has not yet been output from the AND gate 170 (the clock signal ICLKO is still at the low level).

Then, when the inverted clock signal /ICLK subsequently rises (time t3), the Q output of the flip flop 162 (reset signal R4) attains high level. Thereafter, the AND gate 170 outputs the clock signal ICLKO corresponding to the clock signal ICLK.

When the clock signal ICLKO first rises (time t4), the Q output of the flip flop 311 attains high level. Then, when the clock signal ICLKO subsequently rises (time t5), the /Q output of the flip flop 312 attains low level. Further, the reset signal R2 is already low level, and accordingly, the reset signal R3 output from an OR gate 313 attains low level, so that the reset of the flip flop 320 is released. When the clock signal ICLKO subsequently rises (time t6), the flip flop 320 begins to output the clock signal HSCLK.

As hereinabove described, the clock generation unit 100 samples the reset signal R2 with the inverted cock signal /ICLK two times to generate the reset signal R4. The clock generation unit 100 begins to supply the clock signal ICLKO to the transmission units 300, 400 based on the reset signal R4. Therefore, when the clock signal ICLKO is provided to the transmission units 300, 400, the value of the reset signal R2 already attains low level.

Therefore, even where there is a rise of the clock signal ICLK between the fall of the reset signal R2 given to the transmission unit 300 and the fall of the reset signal R2 given to the transmission unit 400, the clock signal ICLKO is not provided at that moment. Therefore, the phase shift of the reset signal R3 can be surprised.

The present invention is not limited directly to the above described embodiments. In practice, the structural elements can be modified without departing from the spirit of the invention. Various inventions can be made by properly combining the structural elements disclosed in the embodiments. For example, some structural elements may be omitted from all the structural elements disclosed in the embodiments. Furthermore, structural elements in different embodiments may properly be combined. It is to be understood that within the scope of the appended claims, the present invention may be practiced other than as specifically disclosed.

What is claimed is:

1. A data transfer apparatus comprising:
    a clock generation unit to generate a first clock signal and a second clock signal by dividing the first clock signal by N (N is an integer of 2 or more);
    a control unit to receive a first reset signal and a first to Sth (S is an integer of two or more) parallel data, the control unit outputting each of the parallel data in synchronization with the second clock signal and a second reset signal in synchronization with the second clock signal; and first and second transmission units each including;
a first reset synchronizing unit to generate a third reset signal upon sampling the second reset signal multiple times using the first clock signal,
a frequency dividing unit to generate a third clock signal from the first clock signal, being reset based on the third reset signal, and
a serializer to convert the parallel data into serial data based on the third clock signal.

2. The data transfer apparatus according to claim 1, wherein each of the first and second transmission units includes;
a first frequency dividing unit to generate the third clock signal by dividing the first clock signal by two, being reset based on the third reset signal, and
a second frequency dividing unit to generate the fourth clock signal by dividing the third clock signal by N/2, being reset based on the third reset signal, and
wherein the serializer receives the parallel data from the control unit based on the fourth clock signal, converts the parallel data into serial data based on the third clock signal, and transmits the serial data to the outside.

3. The data transfer apparatus according to claim 1, wherein the first reset synchronizing unit of the first and second transmission units includes;
a first D-type flip flop having a D terminal to receive a high level signal, operating based on the first clock signal, and reset by the second reset signal;
a second D-type flip flop having a D terminal to receive an output from a Q terminal of the first D-type flip flop, operating based on the first clock signal, and reset by the second reset signal; and
an OR gate to receive an output from a /Q terminal of the second D-type flip flop and the second reset signal, and outputting the third reset signal.

4. The data transfer apparatus according to claim 1, wherein the serializer of the first and second transmission units includes:
a flip flop group including a plurality of flip flops holding and outputting each bit of the parallel data based on the fourth clock signal;
a first shift register to convert the parallel data output from the flip flop group into first serial data based on the third clock signal;
a second shift register to convert the parallel data output from the flip flop group into second serial data based on an inverted signal of the third clock signal;
a selector to alternately select and output the first serial data and the second serial data based on the inverted signal of the third clock signal; and
a driver to transmit an output of the selector to the outside.

5. The data transfer apparatus according to claim 4, wherein the driver differentially outputs the serial data from the selector.

6. The data transfer apparatus according to claim 4, wherein the selector alternately outputs odd-numbered data in the first serial data and even-numbered data in the second serial data.

7. The data transfer apparatus according to claim 1, each of the first and second transmission units further comprising a second reset synchronizing unit to generate a fourth reset signal for controlling supply of the first clock signal to the first and second transmission units, by sampling the second reset signal output from the control unit multiple times based on an inversion signal of the first clock signal.

8. The data transfer apparatus according to claim 7, wherein the second reset synchronizing unit includes;
a third D-type flip flop having a D terminal to receive a high level signal, operating based on the inverted signal of the first clock signal, and reset by the second reset signal; and
a fourth D-type flip flop having a D terminal to receive an output from a Q terminal of the third D-type flip flop, operating based on the inverted signal of the first clock signal, and reset by the second reset signal; and
wherein a fourth reset signal is output from the Q terminal of the fourth D-type flip flop.

9. The data transfer apparatus according to claim 8, wherein the clock generation unit includes AND gate to receive the fourth reset signal from the Q terminal of the fourth D-type flip flop and outputs a fifth clock signal, and the fifth clock signal is input to the first reset synchronizing unit and the first frequency dividing unit.

10. The data transfer apparatus according to claim 7, wherein the control unit includes a fifth D-type flip flop to output the second reset signal to the second reset synchronizing unit in synchronization with the first clock signal.

11. A data transfer apparatus comprising:
a clock generation unit to generate a first clock signal and a second clock signal by dividing the first clock signal by N (N is an integer of 2 or more);
a control unit to receive a first reset signal and a first to Sth (S is an integer of two or more) parallel data, the control unit outputting each of the parallel data in synchronization with the second clock signal and a second reset signal in synchronization with the second clock signal; and first and second transmission units each including;
a reset synchronizing unit to generate a third reset signal upon sampling the second reset signal multiple times using the first clock signal,
a frequency dividing unit to generate a third clock signal from the first clock signal by being reset based on the third reset signal, and
a serializer to convert the parallel data into serial data based on the third clock signal,
wherein there is a phase difference less than one cycle of the first clock signal between the second reset signals used in the first and second transmission units respectively, and the first clock signal does not rise between the falls of the respective second reset signals of the first and second transmission units with the phase difference.

12. The data transfer apparatus according to claim 11, wherein each of the first and second transmission units includes;
a first frequency dividing unit to generate the third clock signal by dividing the first clock signal by two, being reset based on the third reset signal, and
a second frequency dividing unit to generate the fourth clock signal by dividing the third clock signal by N/2, being reset based on the third reset signal, and
wherein the serializer receives the parallel data from the control unit based on the fourth clock signal, converts the parallel data into serial data based on the third clock signal, and transmits the serial data to the outside.

13. The data transfer apparatus according to claim 11, wherein the first reset synchronizing unit of the first and second transmission units includes;

a first D-type flip flop having a D terminal to receive a high level signal, operating based on the first clock signal, and reset by the second reset signal;

a second D-type flip flop having a D terminal to receive an output from a Q terminal of the first D-type flip flop, operating based on the first clock signal, and reset by the second reset signal; and an OR gate to receive an output from a /Q terminal of the second D-type flip flop and the second reset signal, and outputting the third reset signal.

14. The data transfer apparatus according to claim 11, wherein the serializer of the first and second transmission units includes:

a flip flop group including a plurality of flip flops holding and outputting each bit of the parallel data based on the fourth clock signal;

a first shift register to convert the parallel data output from the flip flop group into first serial data based on the third clock signal;

a second shift register to convert the parallel data output from the flip flop group into second serial data based on an inverted signal of the third clock signal;

a selector to alternately select and output the first serial data and the second serial data based on the inverted signal of the third clock signal; and a driver to transmit an output of the selector to the outside.

15. The data transfer apparatus according to claim 14, wherein the driver differentially outputs the serial data from the selector.

16. The data transfer apparatus according to claim 14, wherein the selector alternately outputs odd-numbered data in the first serial data and even-numbered data in the second serial data.

* * * * *